United States Patent

Oh

(10) Patent No.: US 9,450,212 B2
(45) Date of Patent: Sep. 20, 2016

(54) MANUFACTURING METHOD OF ORGANIC LIGHT EMITTING DIODE DISPLAY

(71) Applicant: Samsung Display Co., Ltd., Yongin, Gyeonggi-do (KR)

(72) Inventor: Woo Jin Oh, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/700,541

(22) Filed: Apr. 30, 2015

(65) Prior Publication Data

US 2016/0164044 A1 Jun. 9, 2016

(30) Foreign Application Priority Data

Dec. 3, 2014 (KR) ........................ 10-2014-0172274

(51) Int. Cl.
*H01L 21/00* (2006.01)
*H01L 51/56* (2006.01)
*H01L 51/52* (2006.01)

(52) U.S. Cl.
CPC ............ *H01L 51/56* (2013.01); *H01L 51/5253* (2013.01); *H01L 2251/566* (2013.01)

(58) Field of Classification Search
CPC ............................ H01L 51/56; H01L 51/5253
See application file for complete search history.

(56) References Cited

U.S. PATENT DOCUMENTS

| 9,318,727 B2 * | 4/2016 | Goeoetz ................ H01L 51/529 |
| 9,341,873 B2 * | 5/2016 | Chen .................. G02F 1/133305 |

FOREIGN PATENT DOCUMENTS

| JP | 4928073 | 2/2012 |
| KR | 10-2006-0055613 | 5/2006 |
| KR | 10-0670375 | 1/2007 |
| KR | 10-0741138 | 7/2007 |
| KR | 10-0784665 | 12/2007 |

* cited by examiner

*Primary Examiner* — Richard Booth
(74) *Attorney, Agent, or Firm* — Knobbe Martens Olson & Bear LLP

(57) ABSTRACT

A manufacturing method of an organic light emitting diode display includes: setting, on a mother substrate, a plurality of panel areas of which boundary lines contact each other in a row direction and a column direction; forming a plurality of display units in the plurality of panel areas, respectively; forming a plurality of thin film encapsulations on the plurality of display units, respectively; and cutting the mother substrate along the boundary lines to divide the mother substrate into a plurality of display panels. Forming of the plurality of thin film encapsulations includes forming the thin film encapsulations in panel areas positioned in a first column among the plurality of panel areas and forming the plurality of thin film encapsulations in panel areas positioned in a second column adjacent to the first column.

11 Claims, 11 Drawing Sheets

MANUFACTURING METHOD OF ORGANIC LIGHT EMITTING DIODE DISPLAY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to, and the benefit of, Korean Patent Application No. 10-2014-0172274 filed in the Korean Intellectual Property Office on Dec. 3, 2014, the entire contents of which are incorporated herein by reference.

BACKGROUND

1. Field

The described technology relates generally to an organic light emitting diode display, and to a manufacturing method of the organic light emitting diode display capable of simplifying a cutting process of a mother substrate.

2. Description of the Related Technology

An organic light emitting diode display basically includes a substrate, a display unit formed on the substrate and including a pixel circuit and an organic light emitting diode, and a sealing unit covering and sealing the display unit. The sealing unit blocks moisture and oxygen from permeating toward the organic light emitting diode to prevent degradation of the organic light emitting diode.

In a flexible organic light emitting diode display, the sealing unit is mainly configured by a thin film encapsulation (TFE). The thin film encapsulation has a structure in which at least one inorganic layer and at least one organic layer are alternately laminated one by one. The inorganic layer mainly serves to block moisture and oxygen from permeating, and the organic layer mainly serves to reduce stress onto the inorganic layer and fill in minute cracks, a pin holes, or the like of the inorganic layer.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide a manufacturing method of an organic light emitting diode display capable of simplifying a cutting process of a mother substrate and increasing the number of display panels which may be prepared from one mother substrate to increase productivity.

One embodiment provides a manufacturing method of an organic light emitting diode display including: setting, on a mother substrate, a plurality of panel areas of which boundary lines contact each other in a row direction and a column direction; forming a plurality of display units in the plurality of panel areas, respectively; forming a plurality of thin film encapsulations on the plurality of display units, respectively; and cutting the mother substrate along the boundary lines to divide the mother substrate into a plurality of display panels. The forming of the plurality of thin film encapsulations may include forming the thin film encapsulations in panel areas positioned in a first column among the plurality of panel areas and forming the plurality of thin film encapsulations in panel areas positioned in a second column adjacent to the first column.

The panel areas positioned in the first column may include panel areas positioned in an odd numbered column, and the panel areas positioned in the second column may include panel areas positioned in an even numbered column.

In forming the thin film encapsulations in panel areas positioned in a first column among the plurality of panel areas, a first deposition mask with a plurality of first openings exposing some of the panel areas positioned in the odd numbered column may be used. In forming the plurality of thin film encapsulations in panel areas positioned in a second column adjacent to the first column, a second deposition mask with a plurality of second openings exposing some of the panel areas positioned in the even numbered column may be used.

Each of the first deposition mask and the second deposition mask may be prepared by a metal plate, and a distance between the first openings and a distance between the second openings in the row direction and the column direction may each be larger than 1.5 mm.

The first deposition mask may be shifted in the row direction to be used as the second deposition mask. The first deposition mask may be prepared by a metal plate, and a distance between the first openings in the row direction and the column direction may be larger than 1.5 mm.

The first deposition mask may include a plurality of first stick masks corresponding to the panel areas in the odd numbered column, and a plurality of first blocking plates positioned between the plurality of first stick masks. The second deposition mask may include a plurality of second stick masks corresponding to the panel areas in the even numbered column, and a plurality of second blocking plates positioned between the plurality of second stick masks.

The first deposition mask may be fixed to a frame in forming the thin film encapsulations in panel areas positioned in a first column among the plurality of panel areas and separated from the frame after forming the thin film encapsulations in panel areas positioned in a first column among the plurality of panel areas. The positions of the plurality of first stick masks and the plurality of first blocking plates may be exchanged with one another in positions to be fixed to the frame and used as the second deposition mask.

The thin film encapsulation may include a first inorganic layer, a first organic layer, and a second inorganic layer, and forming the first inorganic layer, the first organic layer, and the second inorganic layer may include forming the thin film encapsulations in panel areas positioned in a first column among the plurality of panel areas and forming the plurality of thin film encapsulations in panel areas positioned in a second column adjacent to the first column.

The cutting of the mother substrate may include cutting the boundary lines of the panel areas in any one direction of the row direction and the column direction to divide the mother substrate into a plurality of sticks, and cutting the boundary lines of the panel areas in the other direction of the row direction and the column direction in each of the plurality of sticks to divide each stick into a plurality of display panels.

According to some embodiments, it is possible to reduce a time required for the cutting and largely lower a failure rate due to the cutting by simplifying the cutting process of the mother substrate. Further, it is possible to increase produc-

DETAILED DESCRIPTION OF CERTAIN INVENTIVE EMBODIMENTS

Figure 1:
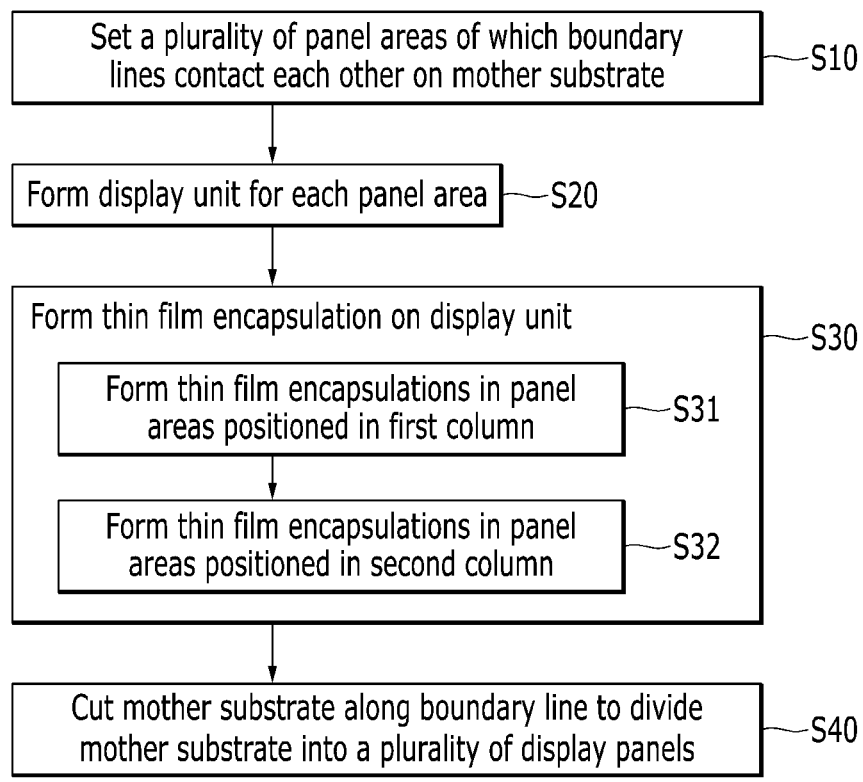
FIG. 1 is a process flowchart illustrating a manufacturing method of an organic light emitting diode display according to an embodiment.

The present disclosure will be described more fully hereinafter with reference to the accompanying drawings, in which certain embodiments of the disclosure are shown. As those skilled in the art would realize, the described embodiments may be modified in various ways, without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

Throughout the specification, unless explicitly described to the contrary, the word "comprise" and variations such as "comprises" or "comprising" will be understood to imply the inclusion of stated elements but not the exclusion of any other elements. In addition, the size and thickness of each configuration shown in the drawings are arbitrarily shown for understanding and ease of description, but the present disclosure is not limited thereto.

A conventional manufacturing process of an organic light emitting diode display includes setting a plurality of panel areas on a mother substrate, forming a plurality of display units and a plurality of thin film encapsulations in the plurality of panel areas, and cutting an edge of each panel area to be divided into a plurality of display panels.

The process of forming the thin film encapsulation is performed in a chamber where a deposition source and a deposition mask are installed. In the deposition mask, a plurality of openings corresponding to a portion where the thin film encapsulation is to be formed in each panel area is formed. The edge of the thin film encapsulation is spaced apart from the edge of each panel area with a predetermined distance (for convenience, referred to as a 'separation distance').

However, when the deposition mask is prepared, making a width of a partition wall (a mask portion between openings) to be two times smaller than the separation distance makes it a technically large difficult. Accordingly, in the mother substrate, the plurality of panel areas may not contact each other on boundary lines, but are spaced apart from each other.

As a result, with respect to two adjacent panel areas, since the edge of each panel area needs to be separately cut twice, a cutting process is complicated. Further, in such a two-step cutting process, since cutting tolerance needs to be considered, the panel areas need to be spaced apart from each other by approximately 3 mm or more. As a result, since the number of display panels which may be prepared by one mother substrate is decreased, productivity is lowered.

FIG. 1 is a process flowchart illustrating a manufacturing method of an organic light emitting diode display according to an embodiment.

Referring to FIG. 1, a manufacturing method of an organic light emitting diode display includes setting a plurality of panel areas on a mother substrate (S10), forming a plurality of display units in the plurality of panel areas, respectively (S20), forming a plurality of thin film encapsulations on the plurality of display units, respectively (S30), and cutting the mother substrate to divide the mother substrate into a plurality of display panels (S40).

Forming a plurality of thin film encapsulations on the plurality of display units (S30) includes two deposition processes, but as a result, in setting a plurality of panel areas on a mother substrate (S10), the plurality of panel areas may be set so that boundary lines contact each other in both a row direction and a column direction. Accordingly, in cutting the mother substrate to divide the mother substrate into a plurality of display panels (S40), the cutting process of the mother substrate may be simplified, and the number of display panels prepared from the mother substrate may be increased.

Figure 2:
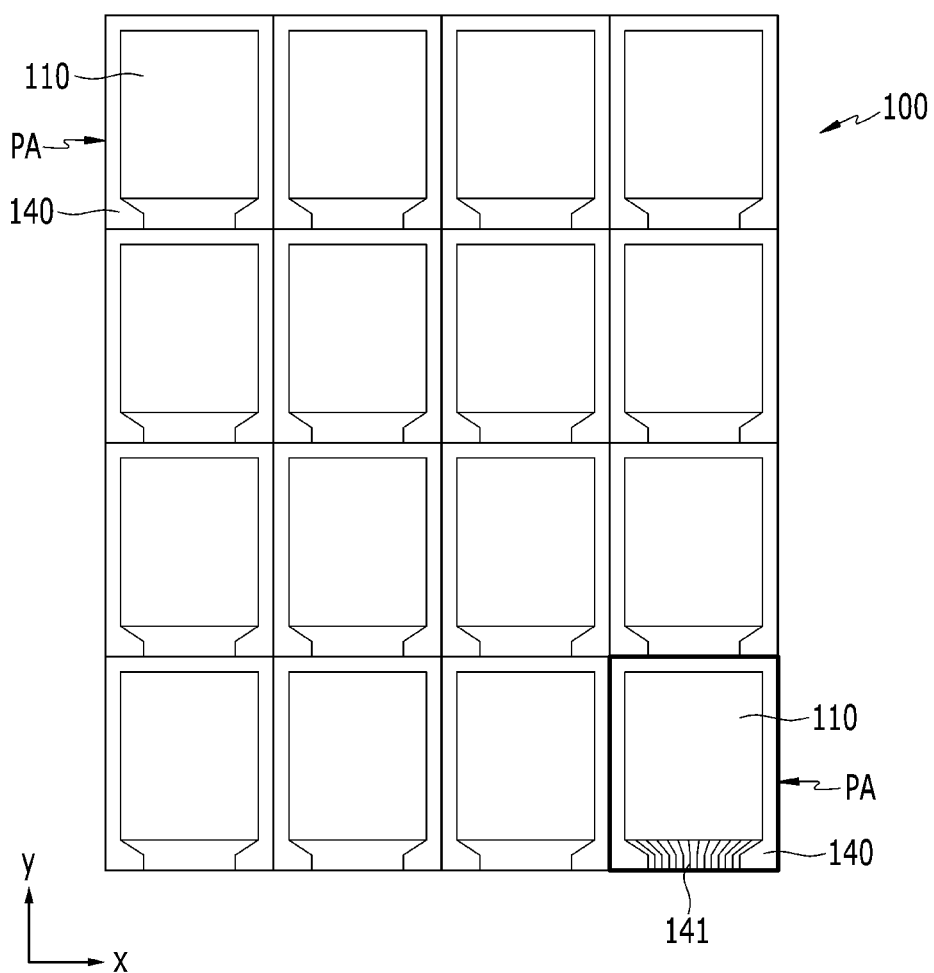
FIG. 2 is a plan view illustrating a mother substrate in a first step and a second step illustrated in FIG. 1.

FIG. 2 is a plan view illustrating a mother substrate in step S10 and step S20 illustrated in FIG. 1.

Referring to FIG. 2, in step S10, a plurality of panel areas PA of which boundary lines contact each other is set on a mother substrate 100. Here, the panel area PA means an area in which the display unit and the thin film encapsulation are hereinafter formed thereon, the panel area PA is cut along a boundary line to be divided into a separate display panel. The plurality of panel areas PA is arranged so that the boundary lines thereof contact each other in the row direction (x-axial direction) and the column direction (y-axial direction).

The mother substrate 100 may be a rigid substrate including glass, quartz, and metal, or a flexible substrate including a plastic film. In the case of the flexible substrate, the mother substrate 100 may include polymer materials having excellent heat resistance and durability such as polyimide and polycarbonate. In step S20, a plurality of display units 110 is formed in the plurality of panel areas PA, respectively.

The display unit 110 is positioned with a predetermined distance from the boundary line of the panel area PA. A space between the display unit 110 and the boundary line of the panel area PA is a dead space which does not contribute to the display and may have a width of approximately 1.5 mm.

A pad region 140 is positioned at one side of the display unit 110 (a lower side based on FIG. 2). A plurality of pad electrodes 141 which is electrically connected with signal lines of the display unit 110 is formed in the pad region 140. After step S40, a chip on film is mounted on the pad region 140, and a driving chip of the chip on film and the plurality of pad electrodes 141 are electrically connected to each other.

Figure 3:
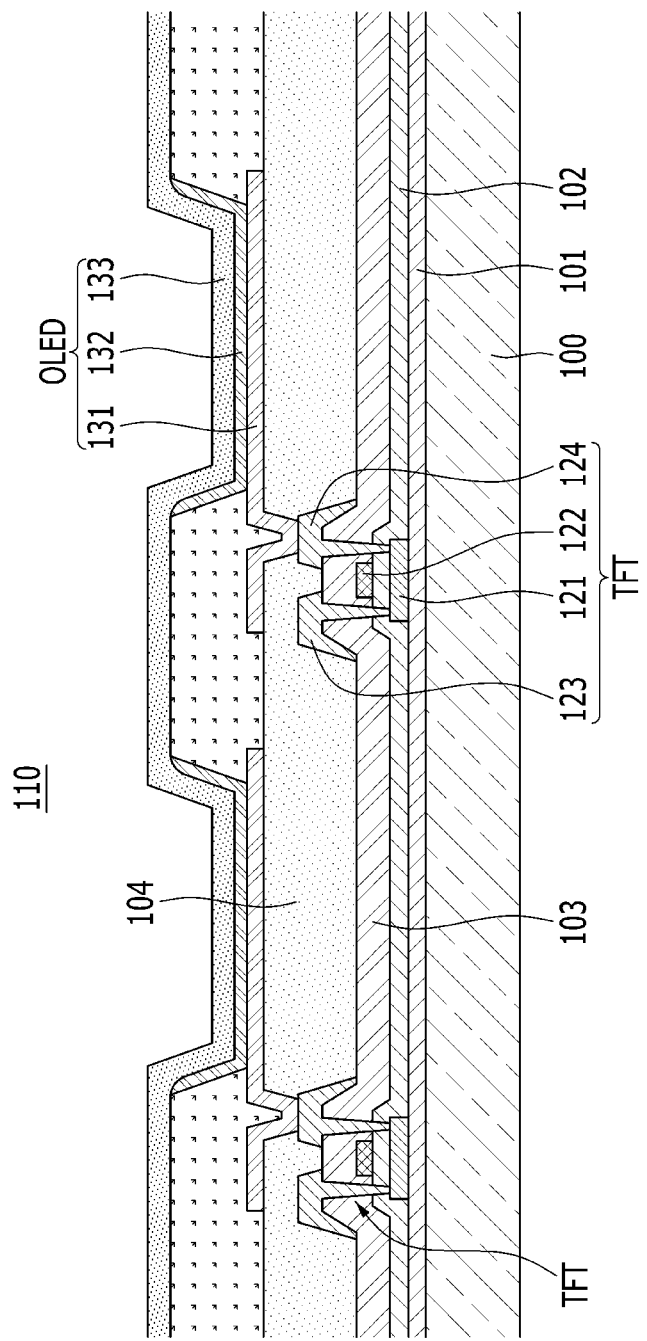
FIG. 3 is a partially enlarged cross-sectional view of a display unit illustrated in FIG. 2.

FIG. 3 is a partially enlarged cross-sectional view of a display unit illustrated in FIG. 2.

Referring to FIG. 3, a buffer layer 101 is formed on the mother substrate 100. The buffer layer 101 serves to prevent an impurity element from permeating through the mother substrate 100 and provides a flat surface to the top of the mother substrate 100. The buffer layer 101 may include an inorganic material such as, for example, $SiO_2$ and SiNx or an organic material such as, for example, polyimide, polyester, and acryl.

A thin film transistor TFT is formed on the buffer layer 101. The thin film transistor TFT includes an active layer 121, a gate electrode 122, a source electrode 123, and a drain electrode 124. The active layer 121 may include polysilicon or oxide semiconductors, and in the case of the oxide semiconductor, a separate passivation layer may be added onto the active layer 121. The active layer 121 includes a channel region, a source region and a drain region which are positioned at both sides of the channel region and doped with impurities.

A gate insulating layer 102 is formed on the active layer 121. The gate insulating layer 102 is to insulate the active layer 121 and the gate electrode 122 from each other and may include an inorganic material such as, for example, $SiO_2$ and SiNx or an organic material. The gate electrode 122 is formed on the gate insulating layer 102. The gate electrode 122 overlaps with the channel region of the active layer 121 and may include Au, Ag, Cu, Ni, Pt, Pd, Al, Mo, or the like.

An interlayer insulating layer 103 is formed on the gate electrode 122. The interlayer insulating layers 103 are disposed between the gate electrode 122 and the source electrode 123 and between the gate electrode 122 and the drain electrode 124 to insulate them from each other. The interlayer insulating layer 103 includes an inorganic material such as, for example, $SiO_2$ and SiNx and may have a double-layer structure of a $SiO_2$ layer and a SiNx layer.

The source electrode 123 and the drain electrode 124 are formed on the interlayer insulating layer 103. Via holes are formed in the interlayer insulating layer 103 and the gate insulating layer 102 to expose the source region and the drain region of the active layer 121, and through the via holes, the source electrode 123 contacts the source region and the drain electrode 124 contacts the drain region.

In FIG. 3, a top gate type thin film transistor TFT is illustrated as an example, but a structure of the thin film transistor TFT is not limited to the illustrated example. The thin film transistor TFT is covered and protected by the passivation layer 104 and electrically connected to the organic light emitting diode OLED to drive the organic light emitting diode OLED.

The passivation layer 104 includes an inorganic insulating layer or an organic insulating layer, or may include a laminated structure of the inorganic insulating layer and the organic insulating layer. The inorganic insulating layer may include $SiO_2$, SiNx, $Al_2O_3$, $TiO_2$, $Ta_2O_5$, $HfO_2$, $ZrO_2$, or the like, and the organic insulating layer may include polymethylmethacrylate (PMMA), polystyrene (PS), an acryl-based polymer, an imide-based polymer, an arylether-based polymer, or the like.

The organic light emitting diode OLED is formed on the passivation layer 104, and includes a pixel electrode 131, an organic emission layer 132, and a common electrode 133. One pixel electrode 131 is provided for each subpixel and contacts the drain electrode 124 through the via hole formed in the passivation layer 104. The common electrode 133 is formed on the entire display area. The organic emission layer 132 includes a light emission layer, and may include at least one of a hole injection layer, a hole transport layer, an electron transport layer, and an electron injection layer.

One of the pixel electrode 131 and the common electrode 133 serves as an anode injecting a hole to the organic emission layer 132, and the other electrode serves as a cathode injecting an electron to the organic emission layer 132. The hole and the electron are coupled with each other in the organic emission layer 132 to generate an exciton, and light is emitted by energy generated when the exciton falls from an excited state to a ground state.

In the case where the organic light emitting diode display is a front emission type, the pixel electrode 131 includes a metal reflective film, and the common electrode 133 includes a transparent conductive film or a translucent conductive film. The light emitted from the organic emission layer 132 is reflected from the pixel electrode 131 and passes through the common electrode 133 to be emitted to the outside.

The metal reflective film may include at least one of Au, Ag, Mg, Al, Pt, Pd, Ni, Nd, Ir, Cr, or the like. The transparent conductive film may include at least one of indium tin oxide (ITO), indium zinc oxide (IZO), ZnO, $In_2O_3$, or the like. The translucent conductive film may include a metal thin film including at least one of Li, Ca, LiF/Ca, LiF/Al, Al, Ag, Mg, or the like, and a transparent film such as, for example, ITO, IZO, ZnO, or $In_2O_3$ may be laminated on the translucent conductive film.

A capping layer (not illustrated) may be formed on the common electrode 133. The capping layer servers to protect the organic light emitting diode OLED and optimize light efficiency through refractive index matching in the case of the front emission type. The capping layer may include an organic material such as, for example, α-NPD, NPB, TPD, m-MTDATA, Alq3, or CuPc.

A blocking layer (not illustrated) may be formed on the capping layer. The blocking layer may include an inorganic material such as, for example, LiF, $MgF_2$, $CaF_2$, or the like, and prevents the organic light emitting diode OLED from being damaged by plasma used in a process of forming an inorganic film of thin film encapsulation. Further, the blocking layer may have a function of optimizing light efficiency by matching a refractive index in the case of the front emission type, like the capping layer.

Figure 4:
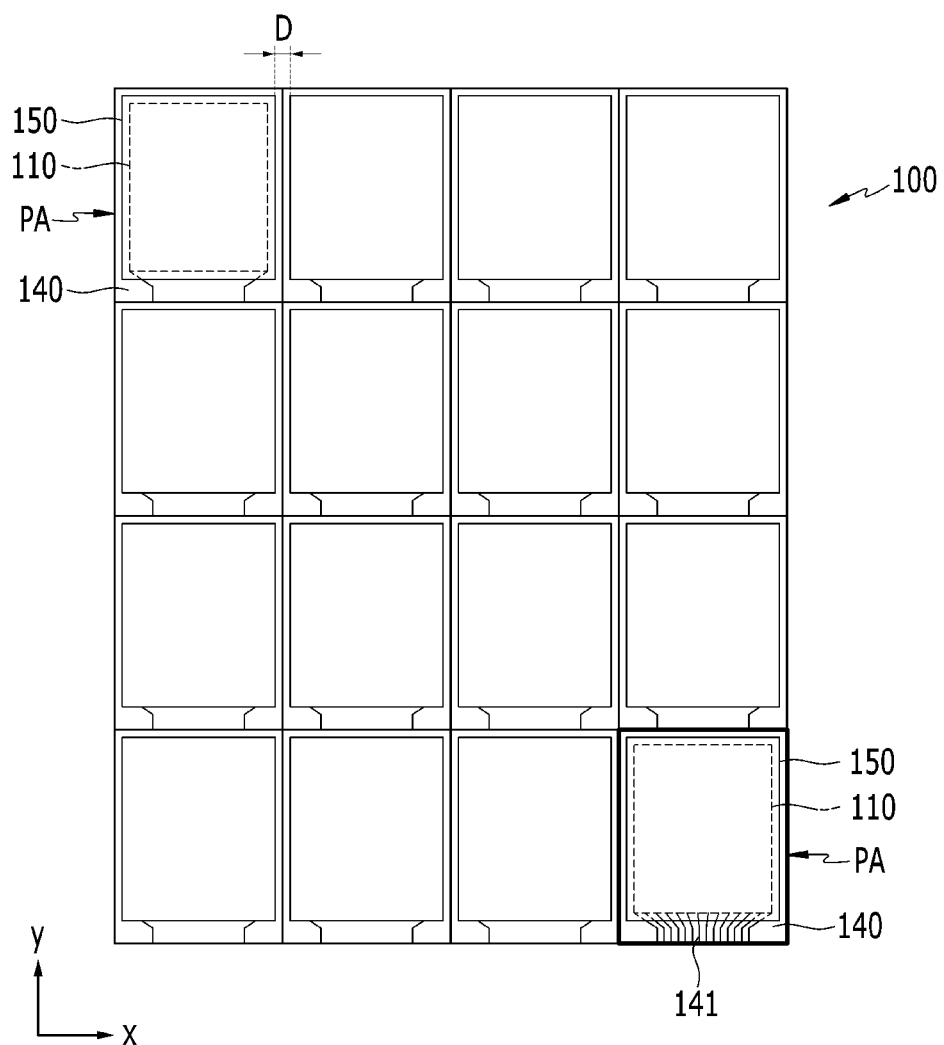
FIG. 4 is a plan view illustrating a mother substrate in a third step illustrated in FIG. 1.
Figure 5:
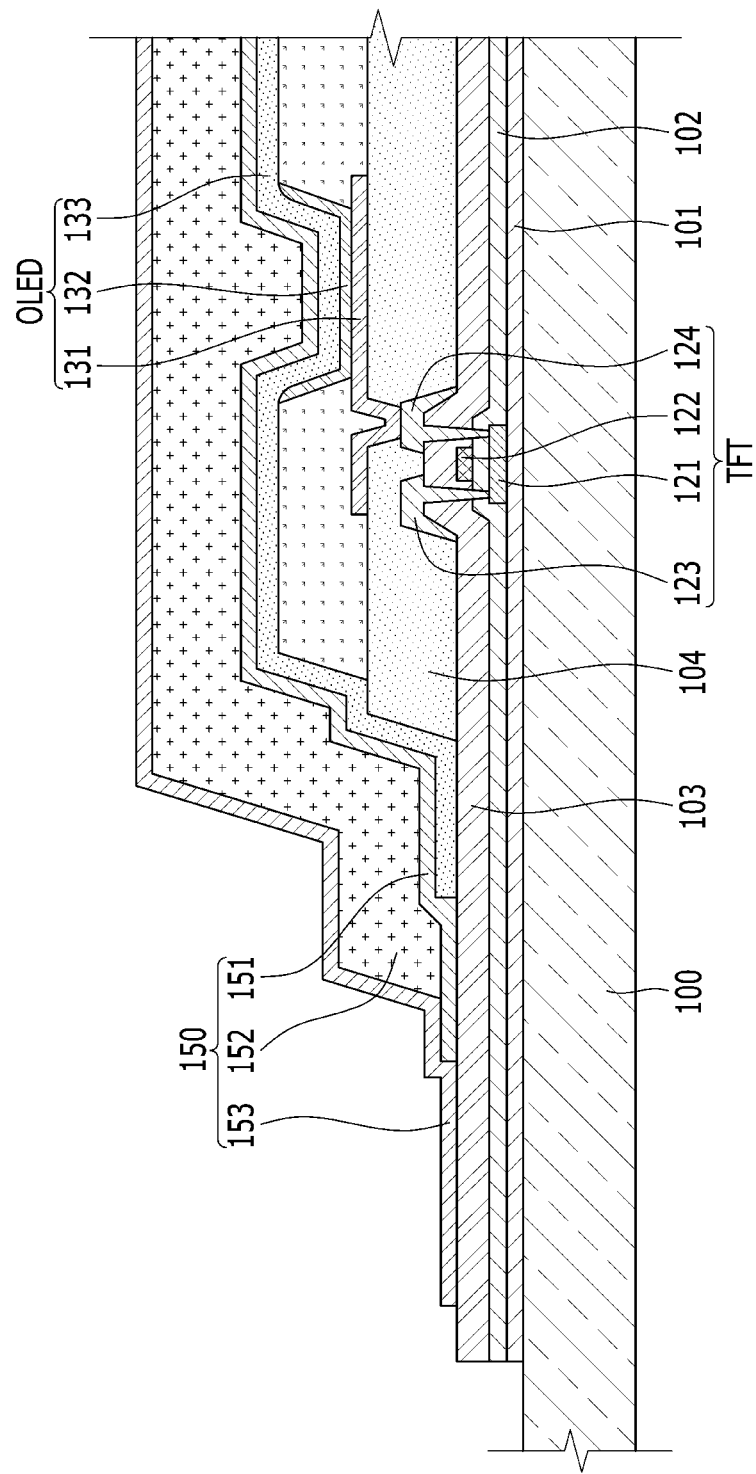
FIG. 5 is a partially enlarged cross-sectional view of a display unit and a thin film encapsulation illustrated in FIG. 4.

FIG. 4 is a plan view illustrating a mother substrate in a third step illustrated in FIG. 1, and FIG. 5 is a partially enlarged cross-sectional view of a display unit and a thin film encapsulation illustrated in FIG. 4.

Referring to FIGS. 4 and 5, in step S30, a plurality of thin film encapsulations 150 is formed on the plurality of display units 110, respectively. Since the organic light emitting diode OLED easily deteriorates by external moisture or oxygen, the thin film encapsulation 150 seals the organic light emitting diode OLED to block contact with external air. The thin film encapsulation 150 is formed to be larger than the display unit 110 and may be positioned at the inside of approximately 0.35 mm from the boundary line of the panel area PA.

The thin film encapsulation 150 includes a first inorganic layer 151, a first organic layer 152, and a second inorganic layer 153. The thin film encapsulation 150 may further include an additional organic layer and an additional inorganic layer which are laminated on the second inorganic layer 153 (not shown). In FIG. 5, the thin film encapsulation 150 configured by sequentially laminating the first inorganic layer 151, the first organic layer 152, and the second inorganic layer 153 is illustrated as an example.

The first inorganic layer 151 may include, for example, aluminum oxide (AlOx). The first organic layer 152 is formed on the first inorganic layer 151 to be smaller than the first inorganic layer 151 and may include, for example, epoxy, acrylate, urethane acrylate, or the like. The second inorganic layer 153 is formed to be larger than the first inorganic layer 151 and the first organic layer 152 to cover edges of the first inorganic layer 151 and the first organic layer 152. The second inorganic layer 153 may include, for example, SiNx.

In the aforementioned display unit 110, the interlayer insulating layer 103 may be formed to be larger than the thin film encapsulation 150, and the second inorganic layer 153 may contact the interlayer insulating layer 103 along the edge. When the interlayer insulating layer 103 and the second inorganic layer 153 include the same kind of inorganic material, for example, SiNx, external moisture and oxygen may be efficiently suppressed from permeating by increasing adhesion of the interlayer insulating layer 103 and the second inorganic layer 153.

The first and second inorganic layers 151 and 153 are formed to be larger than the first organic layer 152 so that the edge of the first organic layer 152 is not exposed to the outside. Since an organic material forming the first organic layer 152 may become a permeating path through which external moisture is transferred, the first organic layer 152 is completely covered by the second inorganic layer 153 to enhance a sealing effect.

The first inorganic layer 151, the first organic layer 152, and the second inorganic layer 153 may be formed by a deposition method using respective deposition masks. The deposition mask is a metal plate having a size corresponding to all or a part of the mother substrate 100 and has a plurality of openings having the same size as a layer to be deposited. The deposition mask is disposed between the deposition source and the mother substrate in the chamber.

In FIG. 4, the plurality of panel areas PA is set so that the boundary lines contact each other, and when the distance between the thin film encapsulation 150 and the boundary line of the panel area PA is for example, approximately 0.35 mm, in two panel areas PA adjacent to each other in the row direction (x-axial direction), a distance D between two thin film encapsulations 150 becomes approximately 0.7 mm.

When the deposition mask for forming the plurality of thin film encapsulations 150 is prepared by processing the metal plate, a minimum width of an implementable partition wall (a mask portion between the openings) is approximately 1.5 mm. When the deposition mask, of which a width of the partition wall in the column direction (y-axial direction) is prepared by approximately 1.5 mm, is applied, boundary lines of two panel areas adjacent to each other in the column direction may not contact each other.

Referring to FIG. 1, step S30 includes a process (S31) of forming thin film encapsulations in the panel areas positioned in a first column among the plurality of panel areas, and a process (S32) of forming thin film encapsulations in the panel areas positioned in a second column adjacent to the first column. The panel areas positioned in the first column may include panel areas positioned in an odd numbered column, and the panel areas positioned in the second column may include panel areas positioned in an even numbered column.

Figure 6:
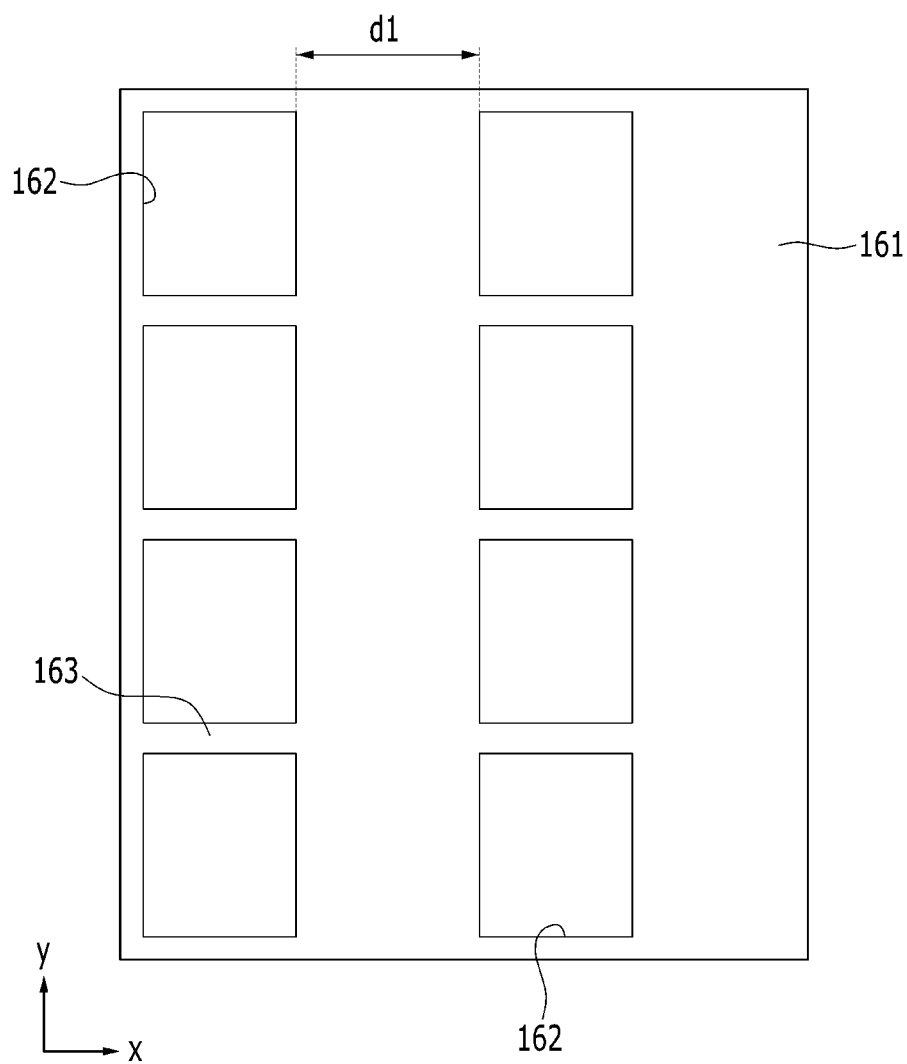
FIG. 6 is a plan view illustrating a first deposition mask used in a first process illustrated in FIG. 1.
Figure 7:
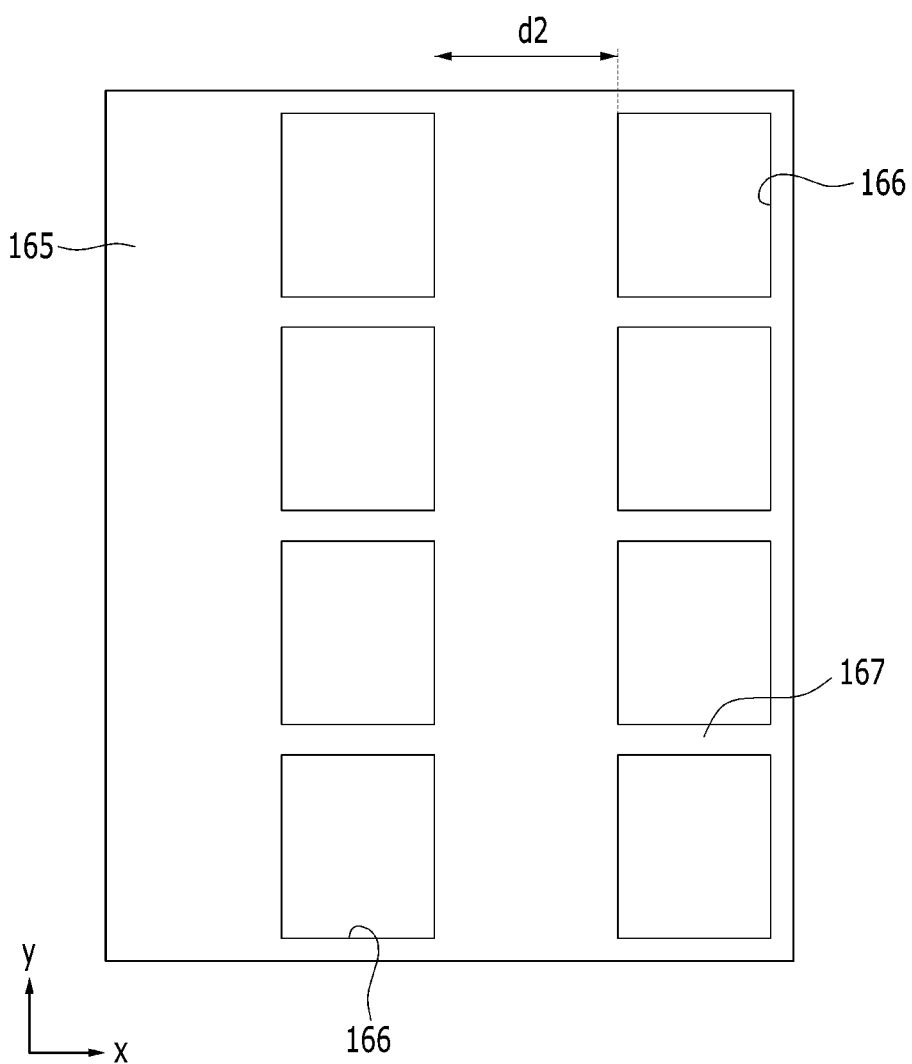
FIG. 7 is a plan view illustrating a second deposition mask used in a second process illustrated in FIG. 1.

FIG. 6 is a plan view illustrating a first deposition mask used in a first process illustrated in FIG. 1, and FIG. 7 is a plan view illustrating a second deposition mask used in a second process illustrated in FIG. 1.

Referring to FIGS. 6 and 7, a plurality of first openings 162 for exposing some of the panel areas PA positioned in the odd column among the plurality of panel areas PA is formed in the first deposition mask 161. A plurality of second openings 166 for exposing some of the panel areas PA positioned in the even column is formed in the second deposition mask 165. The plurality of first openings 162 and the plurality of second openings 166 may be formed with the same size as a layer (any one of the first inorganic layer 151, the first organic layer 152, and the second inorganic layer 153) to be deposited.

In the first process, the thin film encapsulations 150 are formed in the panel areas PA positioned in the odd column by the first deposition mask 161, and thereafter, in the second process, the thin film encapsulations 150 are formed in the panel areas PA positioned in the even column by the second deposition mask 165.

In the first and second deposition masks 161 and 165, distances d1 and d2 between two openings 162 and 166 adjacent in the row direction (x-axial direction) are larger than a width of one panel area PA. In addition, partition walls 163 and 167 between two openings 162 and 166 adjacent in the column direction (y-axial direction) have widths larger than 1.5 mm as a portion corresponding to the pad region 140. As such, in the first and second deposition masks 161 and 165, the partition walls 163 and 167 have widths larger than approximately 1.5 mm which is a minimum width implementable in both the row direction and the column direction.

In step S30, with respect to each of the plurality of layers 151, 152, and 153 configuring the thin film encapsulation 150, the number of deposition masks 161 and 165 is increased to two, the number of times of the deposition is increased to two times, but since the plurality of panel areas PA of which the boundaries contact each other may be set on the mother substrate 100, an advantage of step (S40) to be described below may offset a disadvantage of the step (S30).

The first deposition mask 161 is shifted in the row direction in the step S32 to be used as the second deposition mask. Without providing a separate second deposition mask, both steps S31 and S32 may be performed by using the first deposition mask 161.

Referring to FIG. 1, step S40 includes cutting boundary lines of the panel areas in any one direction of the row direction and the column direction to divide the mother substrate into a plurality of sticks, and cutting boundary lines of the panel areas in the other direction of the row direction and the column direction in each of the plurality of sticks to divide each stick into a plurality of display panels.

Figure 8:
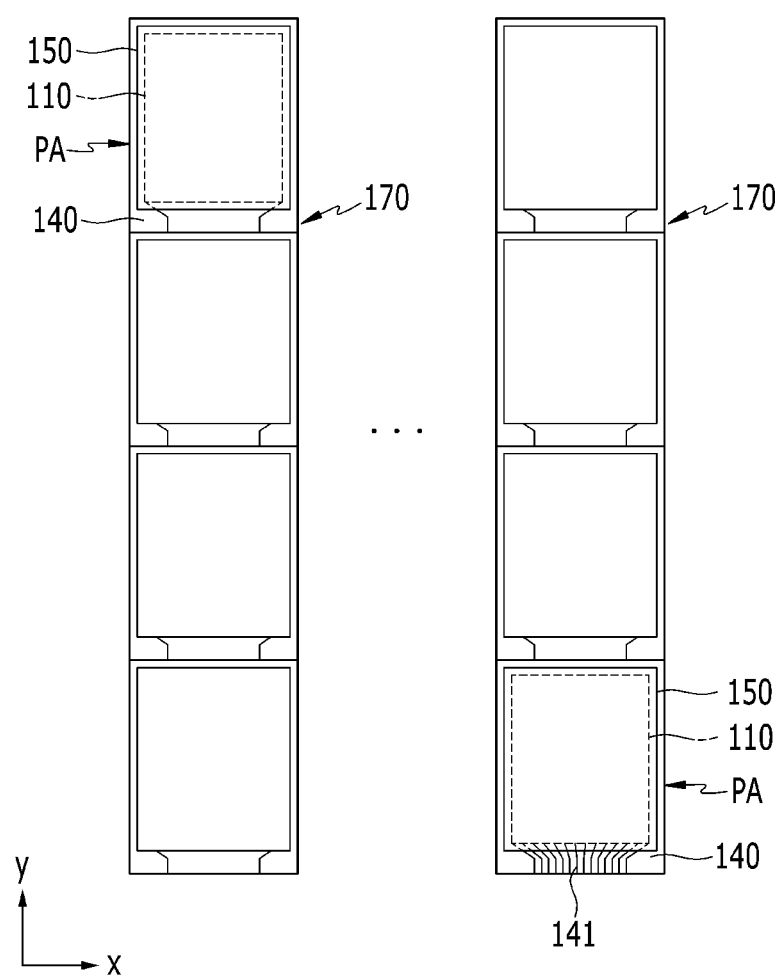
FIG. 8 is a plan view illustrating a stick in a fourth step illustrated in FIG. 1.
Figure 9:
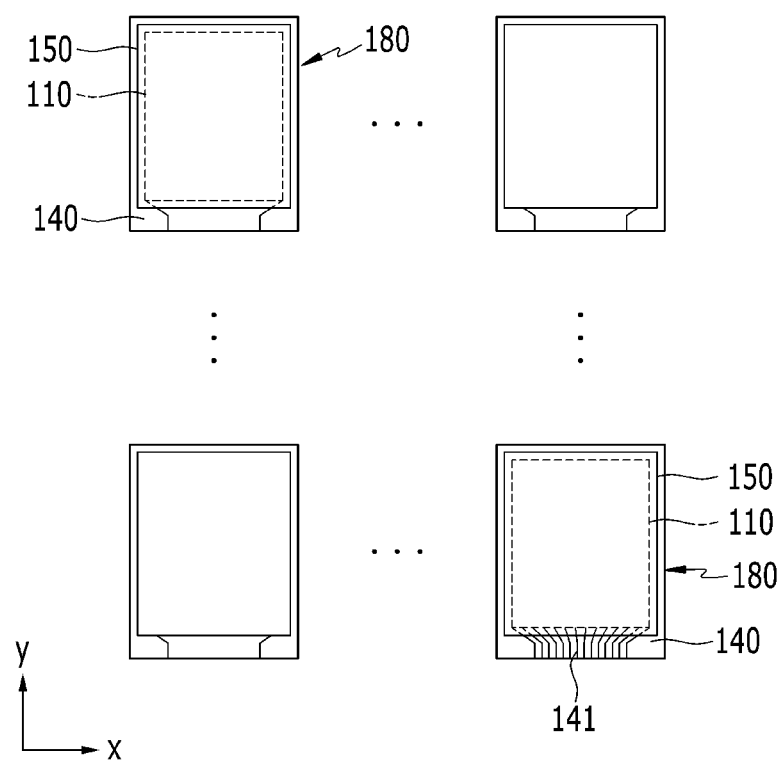
FIG. 9 is a plan view illustrating a display panel in the fourth step illustrated in FIG. 1.

FIG. 8 is a plan view illustrating a stick in a fourth step illustrated in FIG. 1, and FIG. 9 is a plan view illustrating a display panel in the fourth step illustrated in FIG. 1.

Referring to FIGS. 8 and 9, the mother substrate 100 may be cut along boundary lines of the panel areas PA which are parallel with the column direction (y-axial direction). Accordingly, the mother substrate 100 is divided into a plurality of sticks 170, and each stick 170 includes a plurality of panel areas PA which is arranged in the column direction. In addition, each stick 170 is cut along the boundary lines of the panel area PA which are parallel with the row direction (x-axial direction) to be divided into a plurality of display panels 180.

According to the related art in which the thin film encapsulation is formed by a single deposition mask, the boundary lines of the panel areas in the odd column and the boundary lines of the panel areas in the even column are separated from each other. In this case, the cutting process is performed along the boundary lines of the panel areas in the odd column and thereafter, the cutting process is performed along the boundary lines of the panel areas in the even column again (two-step cutting).

However, in embodiments disclosed herein, since the panel area PA in the odd numbered column and the panel area PA in the even numbered column share the boundary line, the mother substrate 100 may be divided into the plurality of sticks 170 by applying one cutting process (one-step cutting). Accordingly, the cutting process of the mother substrate 100 is simplified to thereby reduce a time required for the cutting and largely lower a failure rate due to the cutting.

Further, in the related art, there is a portion which is not used as the display panel but left between the panel areas in each column, but in embodiments disclosed herein, there is no portion which is left between the panel areas PA in each column. Accordingly, the number of display panels 180 which may be prepared from the mother substrate 100 having the same size as the related art may be increased, thereby improving productivity.

For example, in the related art, 36×44 panel areas are set on the mother substrate to be prepared as 1584 display panels. In this case, the number of times of cutting for dividing the mother substrate into the plurality of sticks may be 72 times.

In embodiments disclosed herein, 43×44 panel areas are set on the mother substrate having the same size as the related art to be prepared as 1892 display panels, and the number of times of cutting for dividing the mother substrate into the plurality of sticks may be 44 times. In this case, the rate of increase in the number of display panels is 19.4%, and the rate of reduction in the number of times of cutting is 39%.

Figure 10:
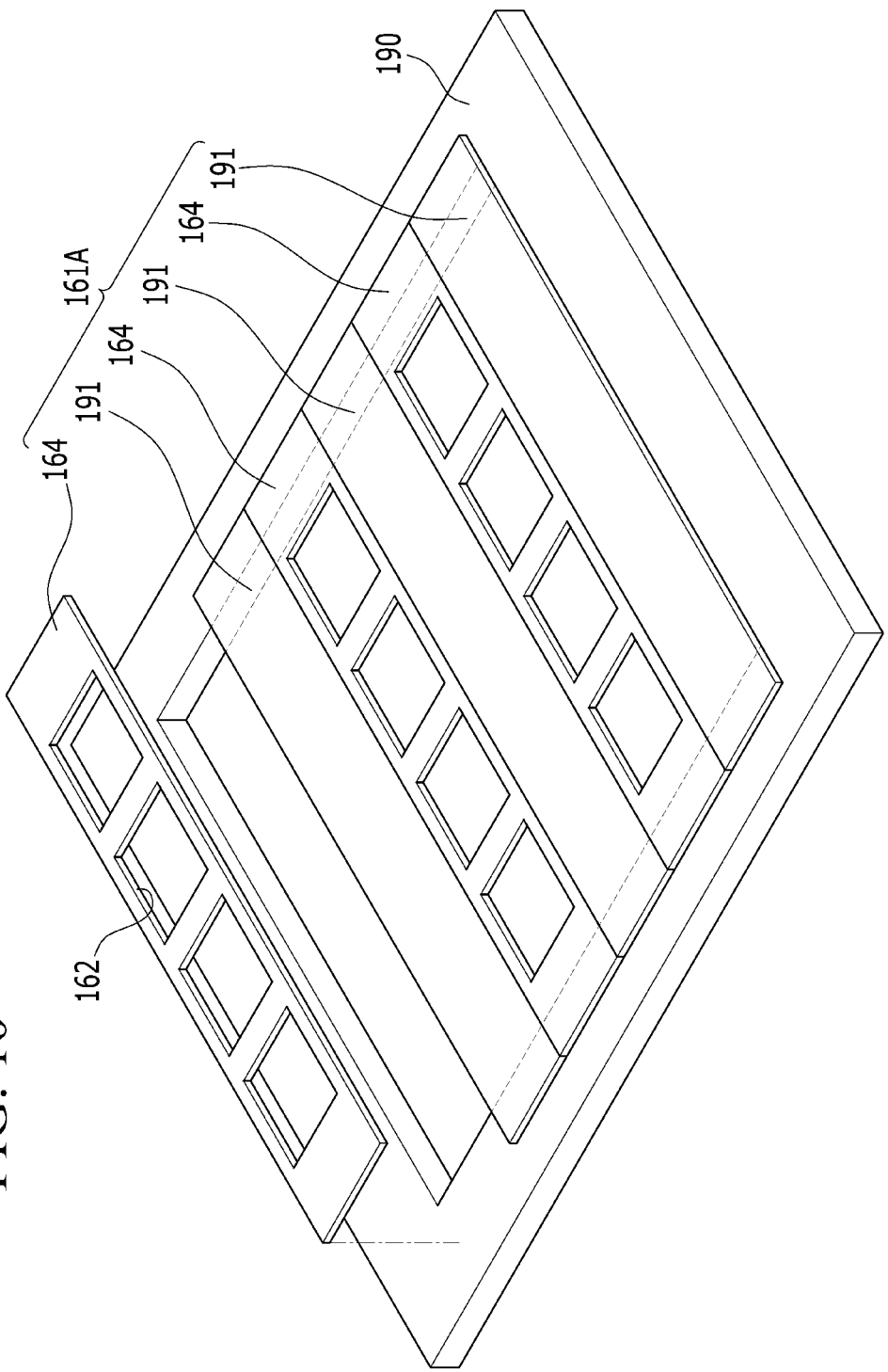
FIG. 10 is a perspective view illustrating a modified example of the first deposition mask illustrated in FIG. 6.
Figure 11:
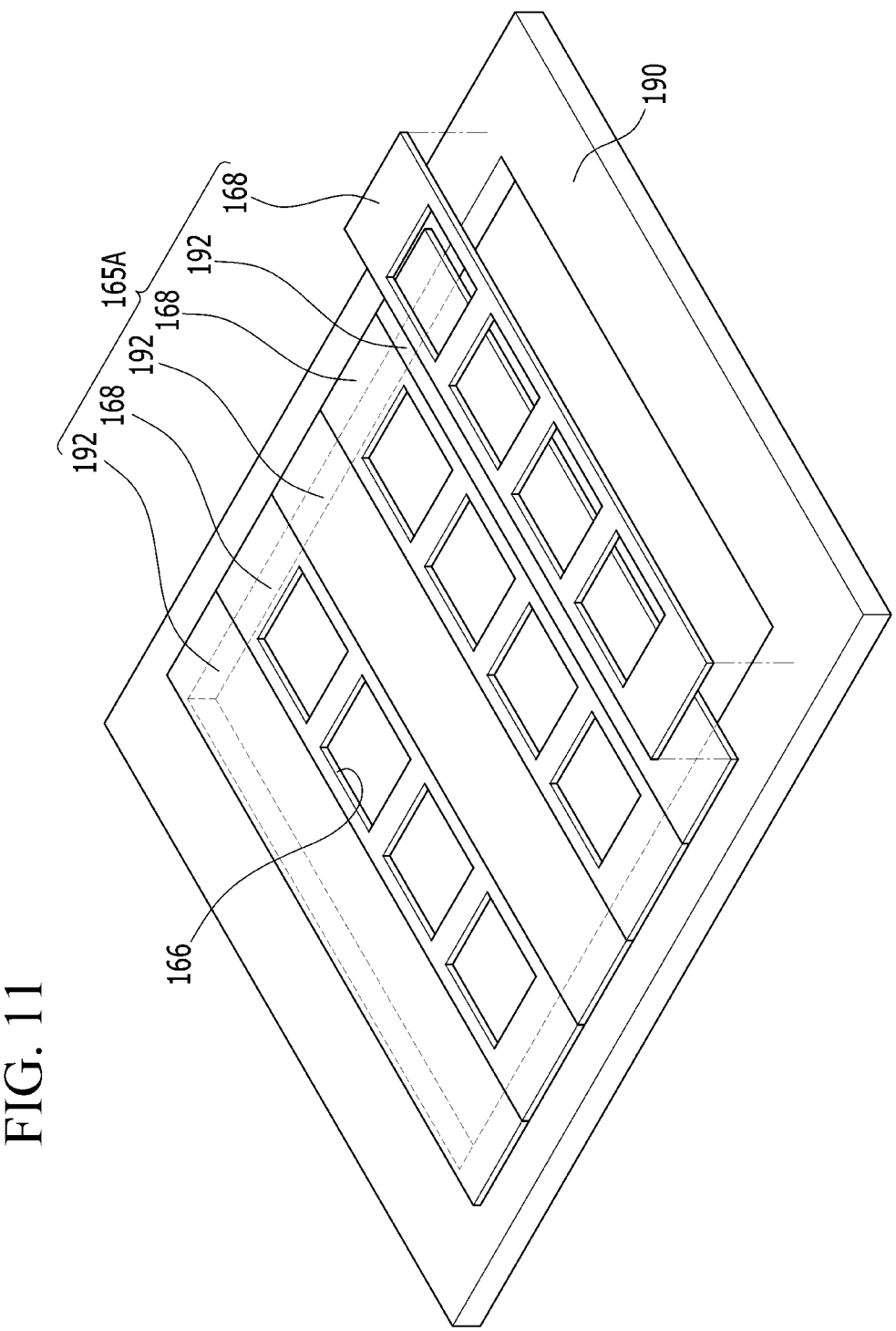
FIG. 11 is a perspective view illustrating a modified example of the second deposition mask illustrated in FIG. 7.

FIG. 10 is a perspective view illustrating a modified example of the first deposition mask illustrated in FIG. 6, and FIG. 11 is a perspective view illustrating a modified example of the second deposition mask illustrated in FIG. 7.

Referring to FIGS. 10 and 11, a first deposition mask 161A may include a plurality of first stick masks 164 corresponding to the panel areas PA in the odd column, and a plurality of first blocking plates 191 positioned between the plurality of first stick masks 164. The first deposition mask 161A is fixed to a frame 190, and the plurality of first stick masks 164 may be fixed to the frame 190 in a state where tension is applied in a length direction.

A second deposition mask 165A may include a plurality of second stick masks 168 corresponding to the panel areas PA in the even column, and a plurality of second blocking plates 192 positioned between the plurality of second stick masks 168. The first deposition mask 165A is also fixed to the frame 190, and the plurality of second stick masks 168 may be fixed to the frame 190 in a state where tension is applied in a length direction.

A plurality of first openings 162 for exposing some of the panel areas PA positioned in the odd column is formed in each of the plurality of first stick masks 164. A plurality of second openings 166 for exposing some of the panel areas PA positioned in the even column is formed in each of the plurality of second stick masks 168.

In a first process (S31), thin film encapsulations 150 are formed in the panel areas PA positioned in the odd column by using the first deposition mask 161A, and thereafter, in a second process (S32), the thin film encapsulations 150 are formed in the panel areas PA positioned in the even column by using the second deposition mask 165A.

The first deposition mask 161A may be separated from the frame 190 after the first process (S31). In addition, the positions of the plurality of first stick masks 164 and the plurality of first blocking plates 191 are changed with each other to be fixed to the frame 190. In this case, the plurality of first stick masks 164 and the plurality of first blocking plates 191 become the second deposition mask 165A to be used in the second process (S32).

The first and second deposition masks 161A and 165A are provided in the stick form, and as a result, in the case where a failure occurs in a predetermined panel area PA while forming the thin film encapsulation 150, a stick mask having the failure may be easily replaced with a new stick mask. Therefore, the entire deposition mask does not need to be discarded to thereby minimize waste of components.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of an organic light emitting diode display, the method comprising:
    setting, on a mother substrate, a plurality of panel areas of which boundary lines contact each other in a row direction and a column direction;
    forming a plurality of display units in the plurality of panel areas, respectively;
    forming a plurality of thin film encapsulations on the plurality of display units, respectively; and
    cutting the mother substrate along the boundary lines to divide the mother substrate into a plurality of display panels,
    wherein forming of the plurality of thin film encapsulations includes forming the thin film encapsulations in panel areas positioned in a first column among the plurality of panel areas and forming the plurality of thin film encapsulations in panel areas positioned in a second column adjacent to the first column.

2. The method of claim 1, wherein:
    the panel areas positioned in the first column include panel areas positioned in an odd numbered column, and
    the panel areas positioned in the second column include panel areas positioned in an even numbered column.

3. The method of claim 2, wherein:
    in forming the thin film encapsulations in panel areas positioned in a first column among the plurality of panel areas, a first deposition mask with a plurality of first openings exposing some of the panel areas positioned in the odd numbered column is used, and
    in forming the plurality of thin film encapsulations in panel areas positioned in a second column adjacent to the first column, a second deposition mask with a plurality of second openings exposing some of the panel areas positioned in the even numbered column is used.

4. The method of claim 3, wherein:
    each of the first deposition mask and the second deposition mask is prepared by a metal plate, and a distance between the first openings and a distance between the second openings in the row direction and the column direction are each larger than 1.5 mm.

5. The method of claim 3, wherein:
the first deposition mask is shifted in the row direction to be used as the second deposition mask.

6. The method of claim 5, wherein:
the first deposition mask is prepared by a metal plate, and
a distance between the first openings in the row direction and the column direction is larger than 1.5 mm.

7. The method of claim 3, wherein:
the first deposition mask includes a plurality of first stick masks corresponding to the panel areas in the odd numbered column, and a plurality of first blocking plates positioned between the plurality of first stick masks.

8. The method of claim 7, wherein:
the second deposition mask includes a plurality of second stick masks corresponding to the panel areas in the even numbered column, and a plurality of second blocking plates positioned between the plurality of second stick masks.

9. The method of claim 7, wherein:
the first deposition mask is fixed to a frame in forming the thin film encapsulations in panel areas positioned in a first column among the plurality of panel areas and separated from the frame after forming the thin film encapsulations in panel areas positioned in a first column among the plurality of panel areas, and
the positions of the plurality of first stick masks and the plurality of first blocking plates are exchanged with one another to be fixed to the frame and used as the second deposition mask.

10. The method of claim 1, wherein:
the thin film encapsulation includes a first inorganic layer, a first organic layer, and a second inorganic layer, and
forming the first inorganic layer, the first organic layer, and the second inorganic layer includes forming the thin film encapsulations in panel areas positioned in a first column among the plurality of panel areas and forming the plurality of thin film encapsulations in panel areas positioned in a second column adjacent to the first column.

11. The method of claim 1, wherein:
the cutting of the mother substrate includes:
cutting the boundary lines of the panel areas in any one direction of the row direction and the column direction to divide the mother substrate into a plurality of sticks, and
cutting the boundary lines of the panel areas in the other direction of the row direction and the column direction in each of the plurality of sticks to divide each stick into a plurality of display panels.

* * * * *